(12) United States Patent
Minn et al.

(10) Patent No.: US 6,509,255 B2
(45) Date of Patent: Jan. 21, 2003

(54) FUSE AREA STRUCTURE HAVING GUARD RING SURROUNDING FUSE OPENING IN SEMICONDUCTOR DEVICE AND METHOD OF FORMING THE SAME

(75) Inventors: Eun-young Minn, Anyang (KR); Young-hoon Park, Suwon (KR); Chi-hoon Lee, Suwon (KR); Myoung-hee Han, Yongin (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/935,971

(22) Filed: Aug. 23, 2001

(65) Prior Publication Data

US 2001/0055848 A1 Dec. 27, 2001

Related U.S. Application Data

(62) Division of application No. 09/715,679, filed on Nov. 17, 2000.

(30) Foreign Application Priority Data

Nov. 26, 1999 (KR) .............................. 99-52996

(51) Int. Cl.$^7$ ................................ H01L 21/44
(52) U.S. Cl. ...................... 438/601; 438/281
(58) Field of Search .................... 438/281, 132, 438/710, 600, 601, 253; 257/699, 620, 978

(56) References Cited

U.S. PATENT DOCUMENTS

| | | | | |
|---|---|---|---|---|
| 5,235,205 A | * | 8/1993 | Lippitt, III | 257/528 |
| 5,567,643 A | * | 10/1996 | Lee et al. | 438/453 |
| 5,618,750 A | * | 4/1997 | Fukuhara et al. | 148/DIG. 55 |
| 5,789,795 A | * | 8/1998 | Sanchez et al. | 257/530 |
| 5,821,160 A | * | 10/1998 | Rodriguez et al. | 438/129 |
| 6,008,075 A | * | 12/1999 | Lien et al. | 438/132 |
| 6,100,118 A | * | 8/2000 | Shih et al. | 438/132 |
| 6,162,686 A | * | 12/2000 | Huang et al. | 257/503 |
| 6,255,715 B1 | * | 7/2001 | Liaw | 257/209 |
| 6,294,474 B1 | * | 9/2001 | Tzeng et al. | 438/600 |

* cited by examiner

Primary Examiner—David Nelms
Assistant Examiner—David Vu
(74) Attorney, Agent, or Firm—Mills & Onello LLP (57) ABSTRACT

A fuse area structure in a semiconductor device and a method of forming the same are provided. A ring-shaped guard ring which surrounds a fuse opening, for preventing moisture from seeping into the side surface of the exposed fuse opening, is included. The guard ring is integrally formed with a passivation film. In order to form the guard ring, a guard ring opening etching stop film is formed on a fuse line. A guard ring opening is formed using the etching stop film, and a contact hole is formed in a peripheral circuit. A conductive material layer for forming an upper interconnection layer is formed on the entire surface of a resultant structure on which the contact hole and the guard ring opening are formed. The conductive material layer formed on the guard ring opening is removed. The exposed etching stop film is removed. Finally, a passivation film is deposited on the entire surface of the resulting structure. Accordingly, the guard ring formed of the passivation film filling the guard ring opening is formed. It is possible to form the guard ring without an additional process, to thus effectively prevent moisture from seeping into interfaces between interlayer dielectric films. Also, an additional photolithography process for forming the guard ring is not necessary since the guard ring opening and the contact hole in the peripheral circuit are simultaneously formed.

6 Claims, 11 Drawing Sheets

FUSE AREA STRUCTURE HAVING GUARD RING SURROUNDING FUSE OPENING IN SEMICONDUCTOR DEVICE AND METHOD OF FORMING THE SAME

RELATED APPLICATIONS

This application is a divisional of copending U.S. application Ser. No. 09/715,679, filed on Nov. 17, 2000, the contents of which are incorporated herein in their entirety by reference.

BACKGROUND OF THE INVENTION

1. Field of the Invention

The present invention relates to a semiconductor device and a method of manufacturing the same, and more particularly, to a fuse area structure in a semiconductor device and a method of forming the same.

2. Description of the Related Art

Semiconductor devices are generally realized by stacking various material layer patterns and covering uppermost layers thereof with passivation films. Passivation films are generally formed of a hard material such as silicon nitride. The passivation film absorbs mechanical, electrical, and chemical shock, thus protecting the semiconductor device inside.

In general, semiconductor devices which include semiconductor memory devices can be subjected to a repair process, in which circuits that do not operate due to defects are replaced with redundant circuits. Alternatively, a trimming process can be performed to change the characteristics of some circuits to be suitable for a particular application. The repair process or the trimming process can be performed by cutting part of a predetermined interconnection by irradiating the interconnection with a laser. The interconnection cut by the laser is referred to as a fuseline. The cut part and an area which surrounds the cut part are referred to as a fuse area.

Figure 1:
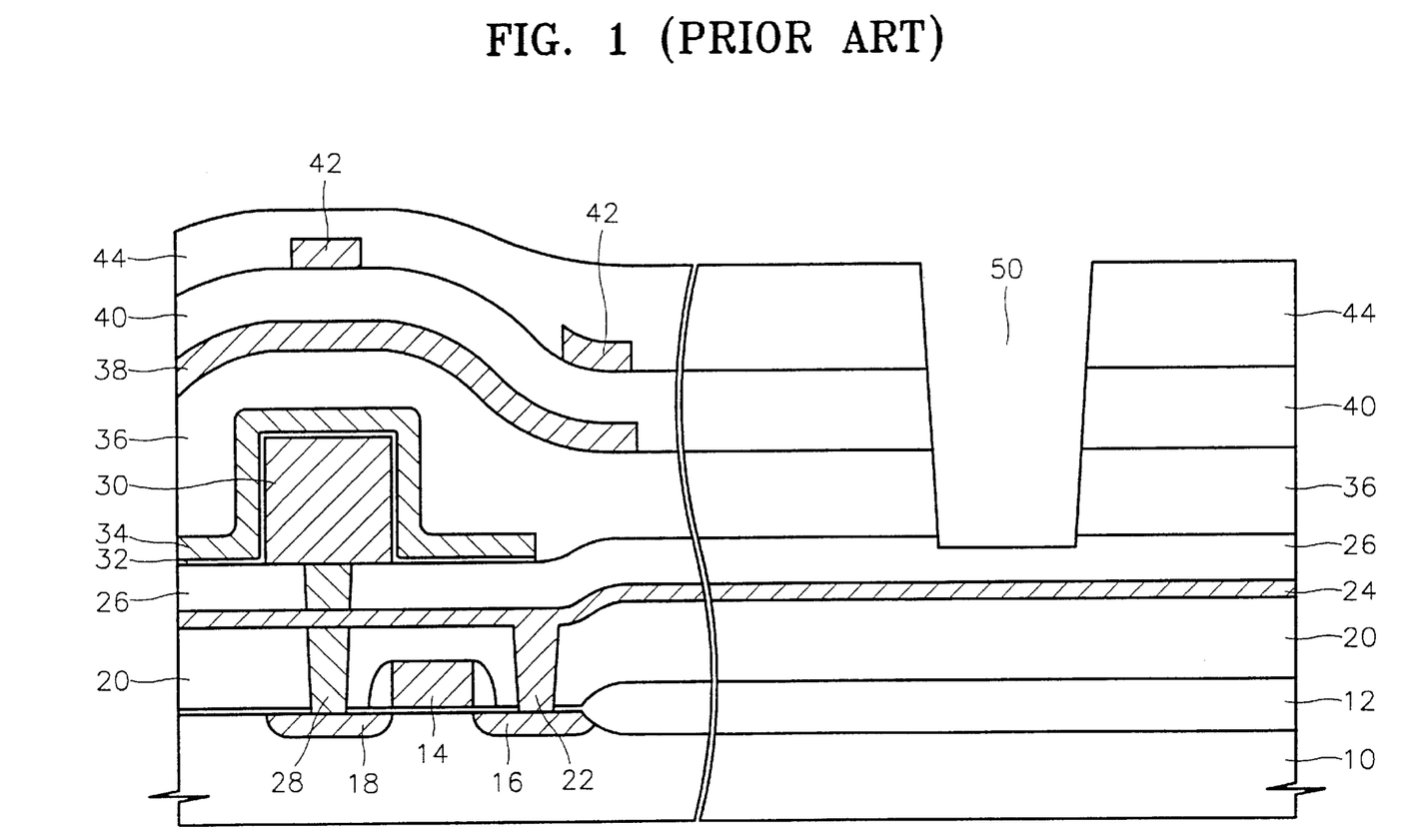
FIG. 1 is a sectional view showing a fuse area structure in a conventional semiconductor device.

FIG. 1 is a sectional view showing part of the memory cell and the fuse area of a conventional semiconductor device, in particular, a DRAM device employing a multi-layer metal interconnection structure. On the left side of FIG. 1 is a cell array area, which includes a memory cell. The memory cell includes a transistor 14, 16, and 18; a capacitor 30, 32, and 34; multi-layer metal interconnections 38 and 42; interlayer dielectric films 20, 26, 36, and 40; and a passivation film 44. Also, on the right side of FIG. 1 is the fuse area, which includes a fuse line, that is, a bitline 24, connected to the drain region 16 of the transistor by a bitline contact plug 22. A fuse opening 50 is formed by etching the interlayer dielectric films 36 and 40 and the passivation film 44 on the fuse line 24 to a predetermined width. To activate the fuse, the laser beam is directed through the fuse opening 50, and the fuse line 24 under the fuse opening 50 is cut.

In this description, each of the interlayer dielectric films 20, 26, 36, and 40 is described as a single layer film. However, each can be a film obtained by stacking multi-layer insulating films. Also, a lower electrode contact plug 28 for electrically connecting the source region 18 of the transistor to a lower electrode 30 of the capacitor is located on a plane different from a plane on which the bitline 24 exists. Namely, the lower electrode contact plug 28 does not contact the bitline 24. Here, it is described that the bitline 24 is used as the fuse line. However, the wordline 14 may also be used as the fuse line. Also, another interconnection can be used as the fuse line in semiconductor devices other than memory devices.

Figure 2:
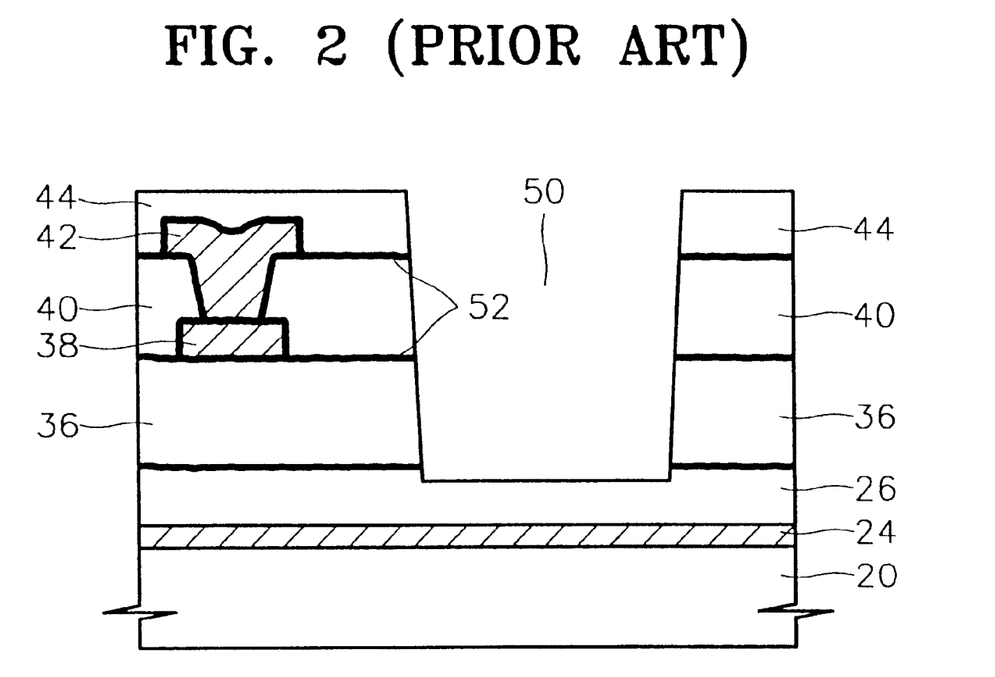
FIG. 2 is a sectional view showing a case where moisture seeps into an interface between interlayer dielectric films on the sidewall of the fuse opening shown in FIG. 1.

The fuse area of the general semiconductor device having the structure as shown in FIG. 1 has certain drawbacks. The interlayer dielectric films 26, 36, and 40 exposed on the sidewall of the fuse opening 50 are formed of silicon oxide, in particular, boron phosphorous silicate glass (BPSG), phosphorous silicate glass (PSG), spin on glass (SOG), tetra ethyl ortho silicate (TEOS), and undoped silicate glass (USG), which have an excellent step coverage, in order to reduce a large step difference between a cell array area and a peripheral circuit area. However, the BPSG, the PSG, the SOG, and the TEOS which contain a large amount of impurities, for example, greater than or equal to 5 weight % of boron or greater than or equal to 4 weight % of phosphorous are vulnerable to moisture. The reliability of the semiconductor device in which the fuse area was formed is tested at a temperature of between 100 and 150° C., a humidity of between 80 and 100%, and a pressure of between 1.5 and 3 atm. At this time, when moisture seeps into the interfaces between the interlayer dielectric films, which are vulnerable to the moisture, as shown in FIG. 2, interfaces between metal interconnections 38 and 42 formed of tungsten or aluminum and the interlayer dielectric films 36 and 40 under the metal interconnections 38 and 42 in an adjacent peripheral circuit are peeled from each other as denoted by reference numeral 52. Accordingly, the electrical resistance of a metal contact increases and the reliability of the semiconductor device is severely deteriorated. It seems, because the energy level of the interface between the layers is lower than the energy level inside the respective layers, that the moisture seeps into the interfaces between the interlayer dielectric films 26, 36, and 40 and the passivation film 44 and the interface between the interlayer dielectric films 36 and 40 and the metal interconnections 38 and 42.

Figure 3:
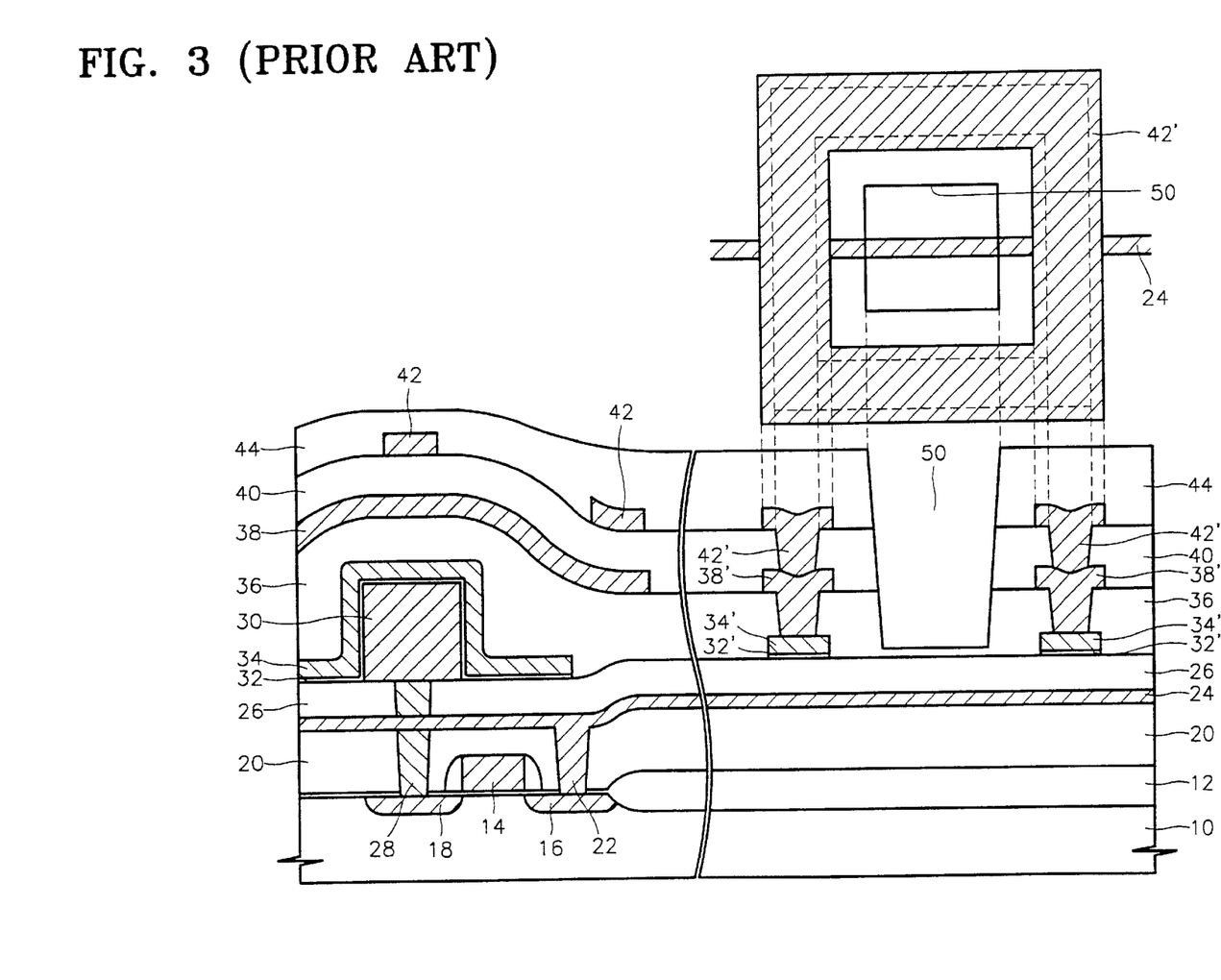
FIG. 3 shows a sectional view and a partial plan view showing a fuse area in which a guard ring is formed according to a conventional method.

In order to solve this problem, square guard rings 38' and 42' which surround the opening 50 as shown in FIG. 3 are provided in the invention disclosed in Japanese Patent Publication No. Hei 9-69571. The two-layered guard rings 38' and 42' and the multi-layered metal interconnections 38 and 42 are simultaneously formed of the same material, for example, aluminum. A ring-shaped etching stop film 34' for stopping etching when the interlayer dielectric film 36 is etched in order to form a guard ring opening is formed under the guard ring 38'. The etching stop film 34' and the capacitor upper electrode 34 are simultaneously formed of the same material, for example, polycrystalline silicon.

Therefore, using the guard rings 38' and 42', it is possible to prevent moisture from seeping into the interlayer dielectric films 36 and 40 of the sidewall of the fuse opening 50. Accordingly, it is possible to improve reliability of the semiconductor device. However, the semiconductor device is still vulnerable to the seeping of moisture into the interlayer dielectric film 26 around which the guard ring is not formed. In particular, the semiconductor device is still vulnerable to the seeping of moisture into interfaces between interlayer dielectric films 26, 36, and 40 and an interface between the guard rings 38' and 42', which are most vulnerable to moisture.

SUMMARY OF THE INVENTION

To solve the above problem, it is an object of the present invention to provide a fuse area structure in a semiconductor device, having a guard ring capable of preventing moisture from seeping into the sidewall of a fuse opening.

It is another object of the present invention to provide a method of forming a guard ring capable of preventing moisture from seeping into the sidewall of the fuse opening.

Accordingly, to achieve the first object, there is provided a fuse area structure in a semiconductor device having a multi-layer metal interconnection structure. The structure includes a ring-shaped guard ring which surrounds the fuse opening. The guard ring is integrally formed with the passivation film. The fuse area in the semiconductor device according to an aspect of the present invention includes a fuse line and multi-layered interlayer dielectric films formed on the fuse line, the multi-layered interlayer dielectric films forming insulating films between metals of the multi-layer metal interconnection. A passivation film covers the uppermost layer of the semiconductor device. A guard ring is integrally formed with the passivation film in the interlayer dielectric films on the fuse line excluding the interlayer dielectric film immediately adjacent to the fuse line. The guard ring fills a ring-shaped guard ring opening which surrounds an area in which the fuse line is to be cut. The fuse opening exposes the interlayer dielectric film that is immediately adjacent to the fuse line. The fuse opening is surrounded by the guard and is formed in the passivation film and the interlayer dielectric films under the passivation film.

According to an embodiment, the fuse area structure can further comprise a protection film formed by extending the passivation film on the sidewall of the fuse opening. The passivation film can be formed of a moisture-proof film such as a silicon nitride film, a silicon oxide film or a compound film of silicon nitride and silicon oxide.

In accordance with another aspect, the invention is directed to a method of forming a fuse area. In accordance with the method, a fuse line is formed, and a first interlayer dielectric film is formed on the fuse line. A ring-shaped guard ring opening etching stop film which surrounds an area in which a fuse opening is to be formed is formed on the first interlayer dielectric film using a predetermined conductive layer of a semiconductor device to be formed. A second interlayer dielectric film is formed on the guard ring opening etching stop film. A contact hole in which the contact of a peripheral circuit is to be formed is formed by etching a part of the second interlayer dielectric film. At the same time, a guard ring opening for exposing the guard ring opening etching stop film is formed in the fuse area. An upper interconnection layer is formed by depositing a conductive material which will form the upper interconnection layer of the semiconductor device on the entire surfaces of the contact hole and the guard ring opening and patterning the conductive material. At the same time, the conductive material deposited on the guard ring opening is removed. A guard ring is formed of the same material as a passivation film by exposing the first interlayer dielectric film by removing the exposed etching stop film of the guard ring opening and depositing the passivation film on the entire surfaces of the upper interconnection layer and the guard ring opening.

According to one embodiment of the present invention, the fuse opening can be formed in an area surrounded by the guard ring opening when the guard ring opening is formed. At this time, the etching stop film can be formed under the fuse opening.

Also, removal of the conductive material deposited on the guard ring opening or the fuse opening, and removal of the guard ring opening etching stopping film or the fuse opening etching stop film under the guard ring opening and the fuse opening, respectively, can be successively performed using etching gas or etching solution having low selectivity with respect to the conductive material and the etching stop films.

Also, it is preferable that the interface between the first interlayer dielectric film and the etching stop film be exposed on the sidewall of the guard ring opening or the fuse opening by slightly over etching the guard ring opening etching stop film or the fuse opening etching stop film when the guard ring etching stop film or the fuse opening etching stop film is removed.

BRIEF DESCRIPTION OF THE DRAWINGS

The foregoing and other objects, features and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DESCRIPTION OF PREFERRED
EMBODIMENTS OF THE INVENTION

The present invention now will be described more fully with reference to the accompanying drawings, in which preferred embodiments of the invention are shown. This invention may, however, be embodied in many different forms and should not be construed as being limited to the embodiments set forth herein; rather, these embodiments are provided so that this disclosure will be thorough and complete, and will fully convey the concept of the invention to those skilled in the art. In the drawings, it will also be understood that when a layer is referred to as being on another layer or substrate, it can be directly on the other layer or substrate, or intervening layers may also be present.

Figure 4:
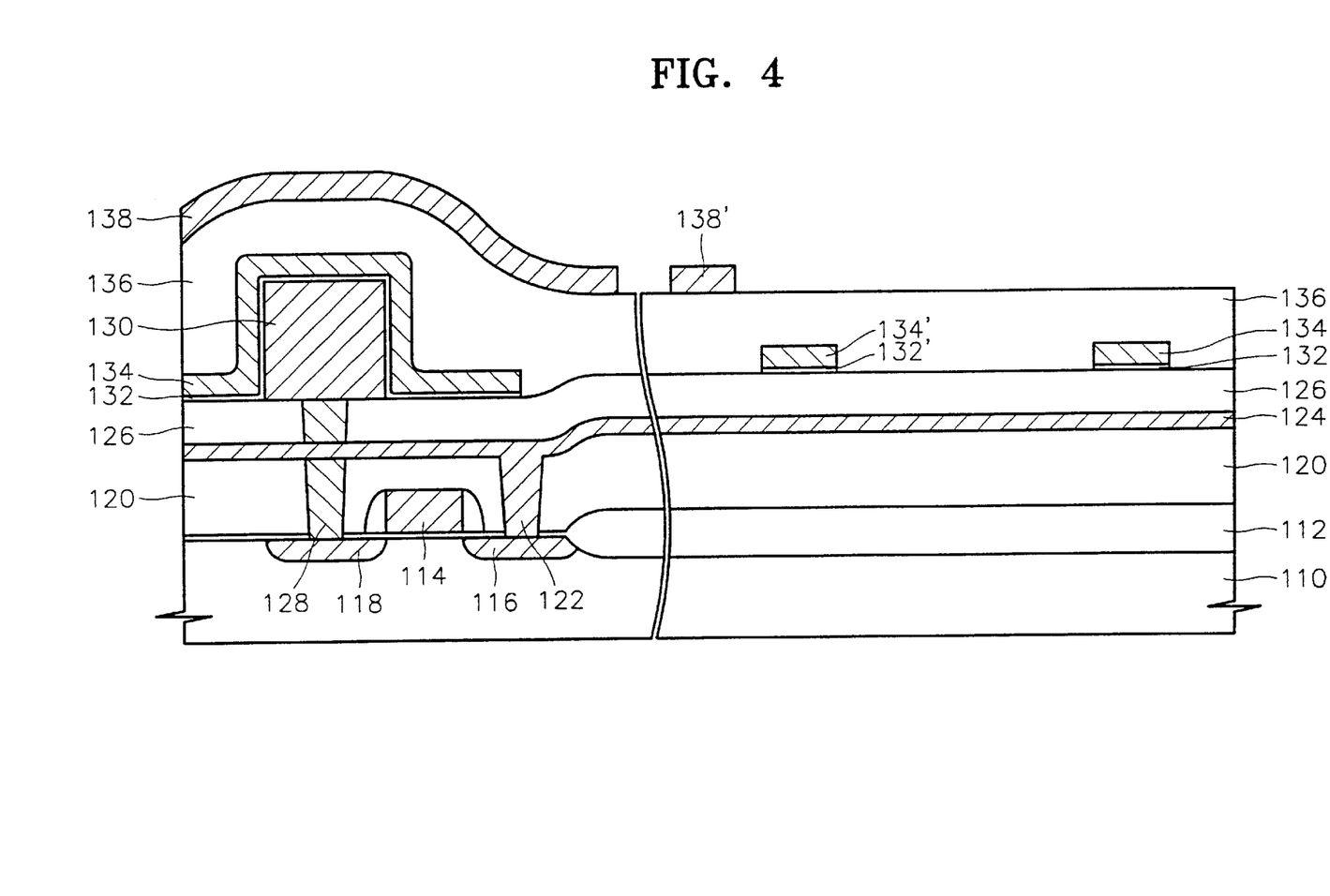
FIGS. 4 through 7 are sectional views showing processes of forming a fuse area according to an embodiment of the present invention and the structure of the fuse area formed thereby.

FIGS. 4 through 7 are sectional views showing processes of forming a fuse area of a semiconductor device according to an embodiment of the present invention and the structure of the fuse area formed thereby. FIG. 4 shows a state in which the lower interconnection layer of a DRAM device is formed. The fuse area of the present embodiment and a cell array area are simultaneously formed. That is, after forming an isolation film 112 on a substrate 110 and a gate electrode 114 and source/drain regions 118 and 116 of a transistor by a known method, an interlayer dielectric film 120 is formed on the entire surface of the substrate. After forming a contact hole which exposes the drain region 116 by etching the interlayer dielectric film 120, a contact plug 122 and a bitline 124 are formed by depositing and patterning a conductive material such as polycrystalline silicon doped with impurities, metal silicide, and a film obtained by stacking polycrystalline silicon and metal silicide. The bitline 124 is used as a fuse line in the fuse area on the right side of FIG. 4. As mentioned above, a wordline 114 can be used as the fuse line. The fuse line can be extended to be concave or convex in order to control the height of the fuse area.

An interlayer dielectric film 126 is deposited on the entire surface of the bitline (the fuse line) 124. In one embodiment, the interlayer dielectric film 126 is formed of silicon oxide to a thickness of between 2,000 and 5,000 Å. A contact hole which exposes the source region 118 is formed by etching the interlayer dielectric films 126 and 120. After forming a contact plug 128 by depositing a conductive material such as polycrystalline silicon doped with impurities on the contact hole, a lower electrode 130 is formed on the contact plug 128. In FIG. 4, the lower electrode 130 is formed as a simple box type, however, it can be formed in various other shapes such as a cylinder and a fin. Hemispherical grains can be formed on the surface of the lower electrode 130. A dielectric film 132 is formed on the entire surface of the lower electrode 130, and a conductive material such as polycrystalline silicon doped with impurities is deposited on the dielectric film 132 to a thickness of between 1,250 and 1,550 Å, thus forming an upper electrode layer.

The upper electrode layer is patterned, thus forming an upper electrode 134. The upper electrode layer is patterned in the form of a ring which surrounds an area into which laser is to be irradiated, that is, an area in which a fuse opening is to be formed in the fuse area on the right side of FIG. 4. In the fuse area, an upper electrode layer pattern 134' patterned in the form of a ring operates as an etching stop film during the etching of the interlayer dielectric film for forming the guard ring opening. When the upper electrode layer is formed of polycrystalline silicon, it can be etched by performing plasma etching using $Cl_2$ having a flow rate of between 30 and 50 sccm and $SF_6$ having a flow rate of between 10 and 20 sccm as etching gases, under a pressure of between 30 and 50 mTorr and an RF power of between 120 and 150W, for between 50 and 70 seconds.

An interlayer dielectric film 136 is formed of silicon oxide having excellent step coverage on the entire surface of the resulting structure, and lower interconnection layer 138 and 138' is formed on the interlayer dielectric film 136. The lower interconnection layer 138 and 138' is formed by depositing a conductive material, for example, a metal such as tungsten or aluminum, on the interlayer dielectric film 136 (a barrier metal layer can be included under the metal layer when the metal is used) and patterning the metal to have a desired interconnection pattern. The conductive material is removed in the fuse area.

Figure 5:
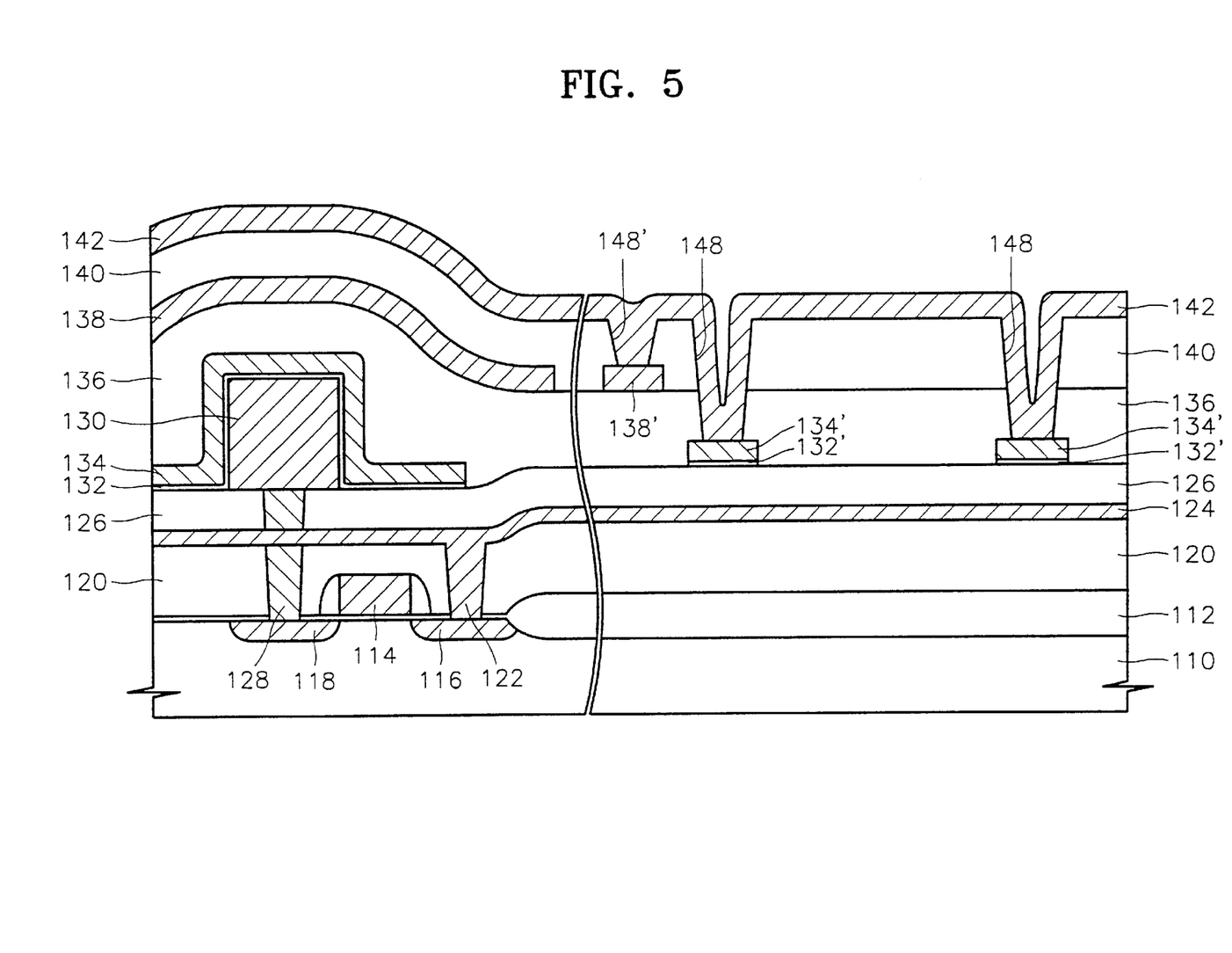

As shown in FIG. 5, a contact hole 148' required for, e.g., a sense amplifier or a split wordline drive in a peripheral circuit area, is formed by depositing a silicon oxide film as an interlayer dielectric film 140 on the entire surface of the resulting structure of FIG. 4 to a thickness of between 5,000 and 10,000 Å and etching the deposited interlayer dielectric film 140. During the etching of the deposited interlayer dielectric film 140, a guard ring opening 148 is simultaneously formed in the fuse area by sequentially etching the interlayer dielectric films 140 and 136 until a guard ring opening etching stop film 134' is exposed. The contact hole 148' and the guard ring opening 148 are etched to have different depths, however, they can be simultaneously formed by etching the interlayer dielectric films 140 and 136 until the lower interconnection layer 138' and the guard ring opening etching stop film 134' are exposed, respectively. To be specific, the contact hole 148' and the guard ring opening 148 can be simultaneously formed by plasma etching the interlayer dielectric films 140 and 136 formed of silicon oxide under a pressure of between 300 and 500 mTorr and an RF power of between 1,100 and 1,400W for between 100 and 150 seconds, using $CF_4$ having a flow rate of between 35 and 50 sccm and $CHF_3$ having a flow rate of between 35 and 50 sccm as etching gases and flowing Ar of between 300 and 450 sccm.

When a conductive material, for example, a metal such as aluminum, is deposited to a thickness of 6,500 and 10,000 Å in order to form an upper interconnection layer on the entire surface of the substrate, a conductive material layer 142 which fills the contact hole 148' and the guard ring opening 148 is formed, as shown in FIG. 5.

Figure 6:
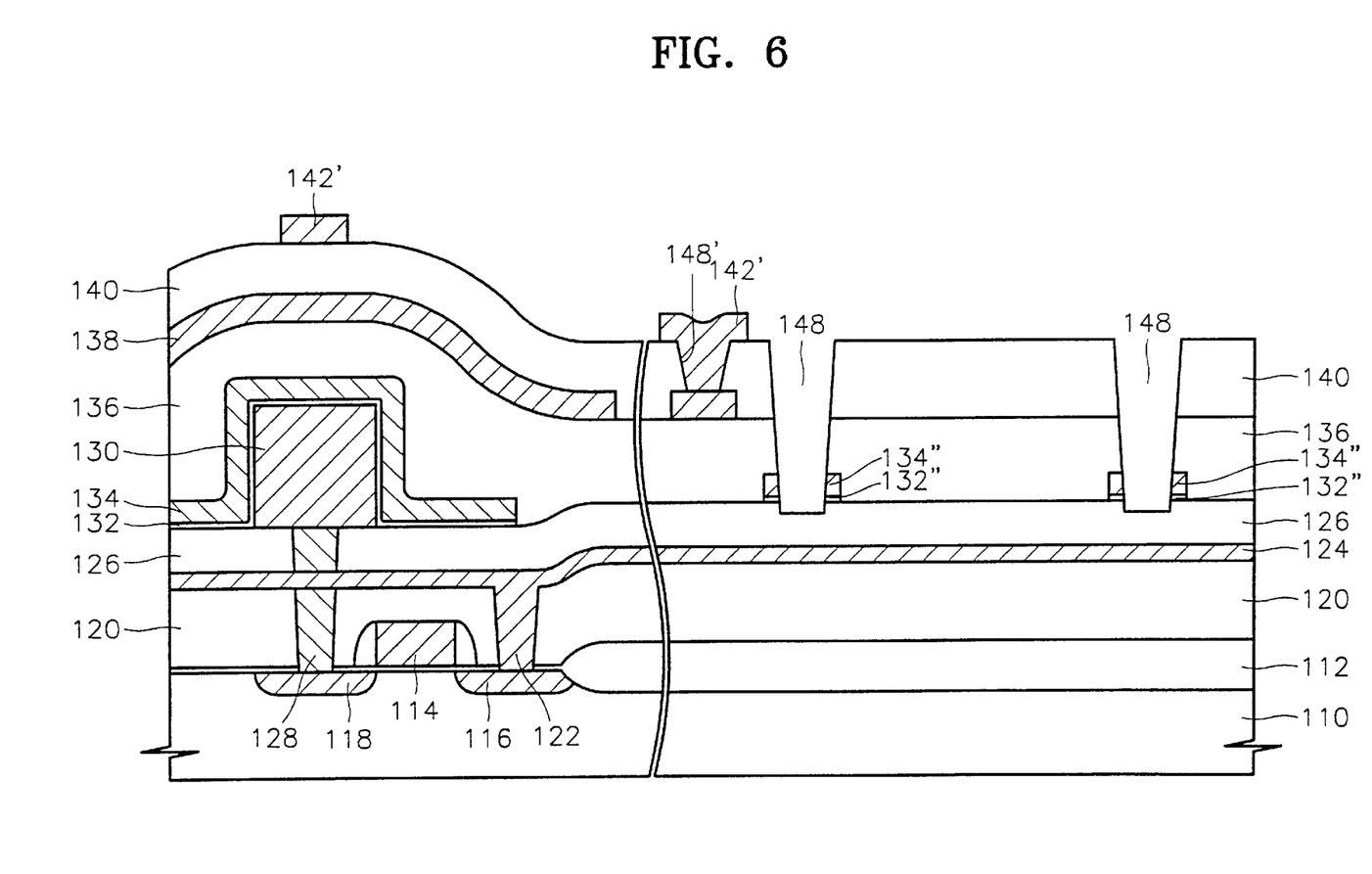

Referring to FIG. 6, the conductive material layer 142 formed on the entire surface of the substrate is patterned, thus forming the upper interconnection layer 142', and the conductive material is removed in the fuse area including the guard ring opening 148. The guard ring opening etching stop film 134' exposed to the guard ring opening 148 by removing the conductive material layer 142 is removed. Some of the guard ring opening etching stop film 134" is left around the guard ring opening 148.

The conductive material layer 142 and the etching stop film 134' formed in the guard ring opening 148 can be removed by two-step etching using an etching gas or an etching solution. However, it is convenient to successively remove the conductive material layer 142 and the etching stop film 134' using etching gas or etching solution having a low etching selectivity with respect to two materials which form the conductive material layer 142 and the etching stop film 134'. That is, when the conductive material layer 142 and the etching stop film 134' are formed of aluminum and polycrystalline silicon, respectively, polycrystalline silicon reacts with aluminum due to heat generated when aluminum is deposited and reflowed, thus being metalized (it is possible to observe by a scanning electron microscope that polycrystalline silicon is metalized). Therefore, the metalized polycrystalline silicon is removed in a process of plasma etching aluminum under a pressure of between 100 and 250 mTorr and an RF power of between 300 and 700W for between 100 and 160 seconds, using $BCl_3$ having a flow rate of between 35 and 60 sccm and $Cl_2$ having a flow rate of between 30 through 50 sccm as etching gases and flowing $N_2$ of between 10 and 25 sccm.

The interlayer dielectric film 126 can be recessed under the conductive material layer 142, and the etching stop film 134' of the guard ring opening 148 can be a predetermined thickness by slightly overetching the conductive material layer 142 and the etching stop film 134 ' of the guard ring opening 148. This is for completely blocking a moisture-absorption path by forming a guard ring for preventing the seeping of moisture in the guard ring opening 148 in the subsequent process after exposing an interface between the interlayer dielectric film 126 and the remaining etching stop film 134", which can be the moisture-absorption path in the sidewall of the guard ring opening 148.

Figure 7:
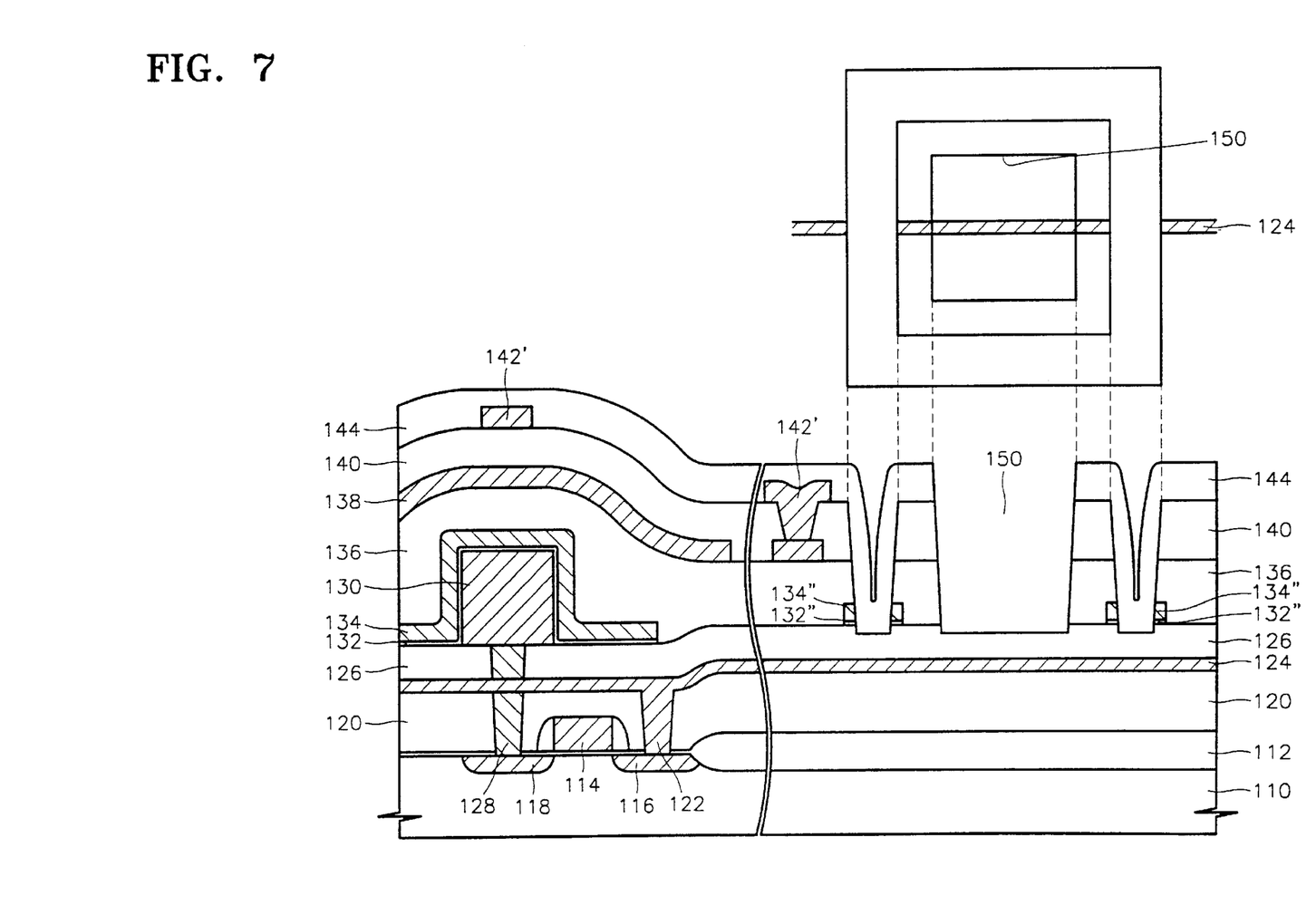

Referring to FIG. 7, a passivation film 144 is formed on the uppermost layer of the device and fills the guard ring opening 148. A fuse opening 150 which exposes the interlayer dielectric film 126 is formed on the fuse line 124 in a portion into which laser is to be directed. In the fuse area having a plane layout shown in the right upper portion of FIG. 7, one fuse opening 150 is formed in one guard ring and one fuse line 124 passes through one fuse opening 150. However, a plurality of fuse openings 150 can be formed in one guard ring and a plurality of fuse lines 124 can pass through one fuse opening 150.

In order to form the fuse area having the structure shown in FIG. 7, a moisture-proof film such as a silicon nitride film, a silicon oxide film which is not doped with impurities or has a low doping concentration, or a compound film of the above films is formed on the entire surface of the resultant of FIG. 6. In the present embodiment, the silicon oxide film which is not doped with impurities is deposited to a thickness of between 1,000 and 2,000 Å and the silicon nitride film is deposited on the silicon oxide film to a thickness of between 5,000 and 10,000 Å. Then, the interfaces between the interlayer dielectric films 126, 136, and 140, which can be the moisture-absorption paths and which had been exposed to the guard ring opening 148, are covered with the passivation film 144, thus forming the guard ring.

The interlayer dielectric film 126 of a predetermined thickness is left on the fuse line 124 by sequentially etching the passivation film 144 and the interlayer dielectric films 140, 136, and 126 in order to form the fuse opening 150 into which laser is to be directed. The interfaces between the interlayer dielectric films 126, 136 and 140, and the passivation film 144, are exposed on the sidewall of the fuse opening 150. However, moisture is prevented from seeping into the interfaces by the guard ring.

The passivation film 144 and the interlayer dielectric films 140, 136, and 126 are etched for a predetermined period of time in order to form the fuse opening 150 shown in FIG. 7. However, the passivation film 144 and the interlayer dielectric films 140, 136, and 126 can be etched using the etching stop film in order to control the thickness of the interlayer dielectric film 126 on the fuse line 124 to be appropriate. That is, in FIG. 4, when the upper electrode layer is patterned, the upper electrode layer pattern is left not only in an area where the guard ring opening etching stop film 134' is to be formed but also in an area where the fuse opening 150 is to be formed. Accordingly, the upper electrode layer pattern can be used as the etching stop film when the passivation film 144 and the interlayer dielectric films 140 and 136 are etched in order to form the fuse opening 150 (refer to FIG. 8). After the formation of the fuse opening, a process of etching the exposed upper electrode layer pattern must be added, and an appropriate thickness of the interlayer dielectric film 126 left on the fuse line 124 can be controlled by overetching the upper electrode layer pattern if necessary.

FIGS. 8 through 11 are sectional views showing processes of forming a fuse area according to another embodiment of the present invention and the structure of the fuse area formed thereby. In the present embodiment, the fuse opening and the guard ring opening are simultaneously formed. The present embodiment will now be described based on the difference between the above-mentioned embodiment and the present embodiment.

Figure 8:
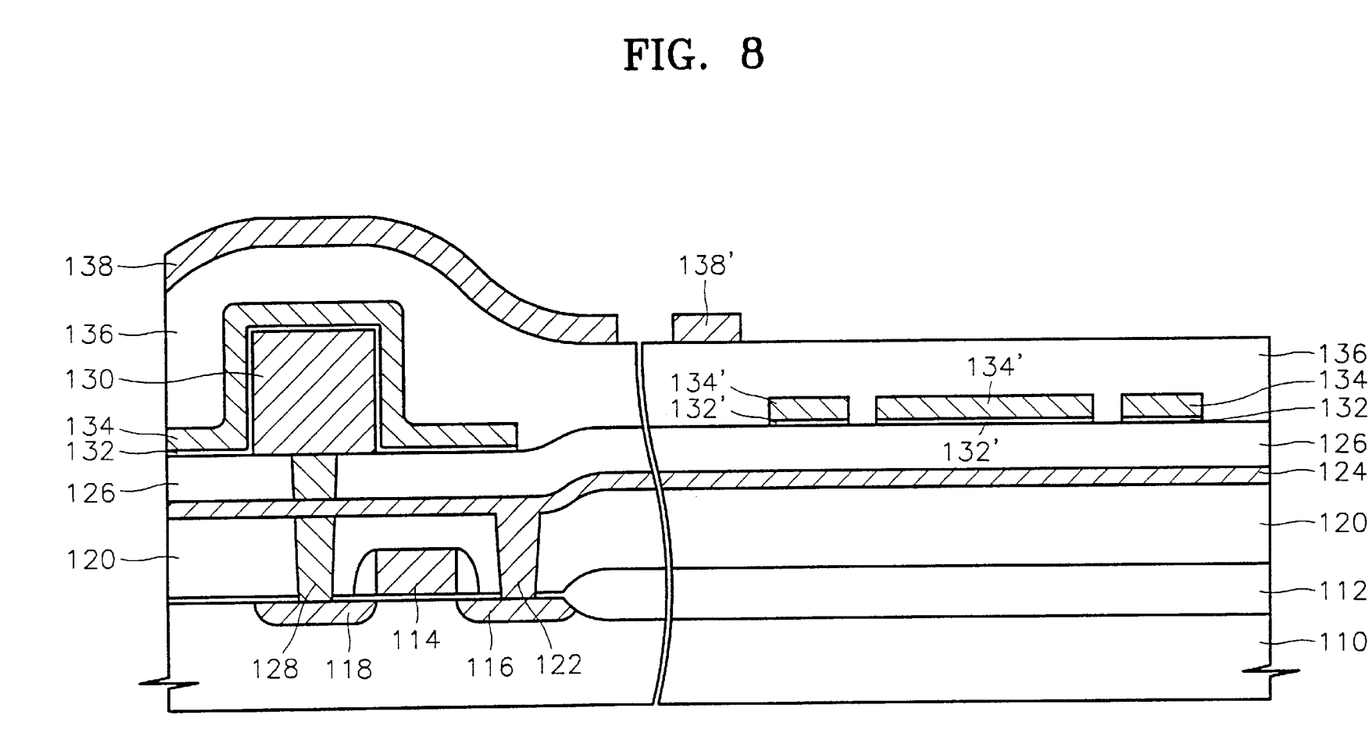
FIGS. 8 through 11 are sectional views showing processes of forming a fuse area according to another embodiment of the present invention and the structure of the fuse area formed thereby.

The lower interconnection layer 138 and 138' of the semiconductor device are formed as shown in FIG. 8. In contrast to the embodiment of FIG. 4, the upper electrode layer pattern 134' is left not only in an area where the guard ring is to be formed but also in an area where the fuse opening is to be formed. That is, the fuse opening etching stop film is formed together with the guard ring opening etching stop film. The guard ring opening etching stop film and the fuse opening etching stop film are patterned such that they are separated from each other. However, the two etching stop films, that is, the upper electrode layer patterns 134', can be patterned such that they are connected to each other when the two etching stop films are etched after the conductive material layer 142 (refer to FIG. 10).

Figure 9:
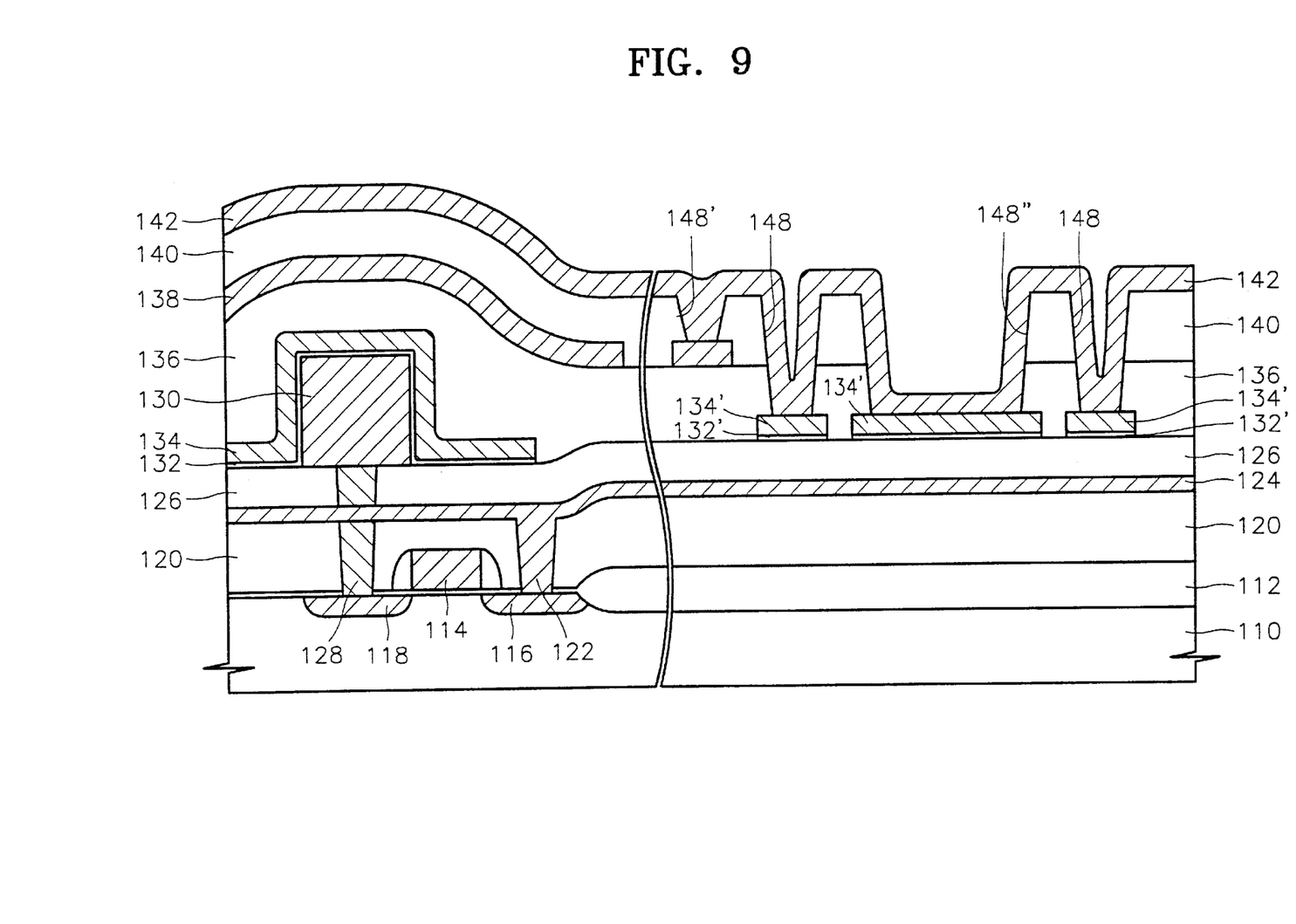

The contact hole 148' and the guard ring opening 148 in the peripheral circuit are formed as described with reference to FIG. 5. As shown in FIG. 9, a fuse opening 148" is simultaneously formed when the contact hole 148' and the guard ring opening 148 are formed by etching the interlayer dielectric films 140 and 136 in a portion into which laser is to be irradiated, until the fuse opening etching stop film 134' is exposed. The conductive material layer 142 which forms the upper interconnection layer is formed on the entire surface of the substrate.

Figure 10:
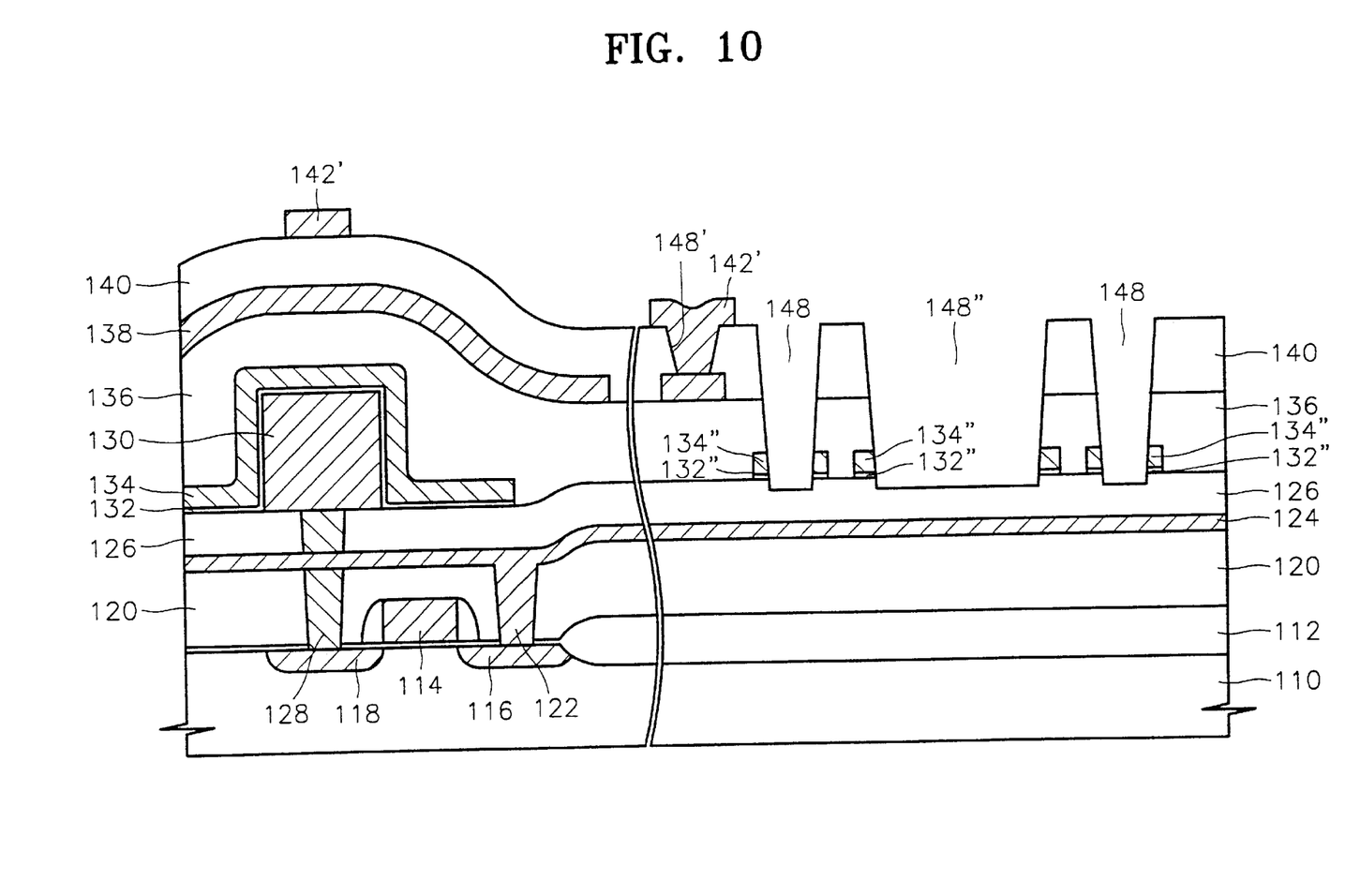

As shown in FIG. 10, the upper interconnection layer 142' of the device is formed by etching the conductive material layer 142, and the conductive material deposited on the guard ring opening 148 and the fuse opening 148" is removed. The etching stop films 134' of the guard ring opening 148 and the fuse opening 148" are removed. The etching stop films 134' are removed by continuously etching the etching stop film 134' after etching the conductive material layer 142, using etching gas or etching solution having a low etching selectivity with respect to the etching stop films 134' and the conductive material layer 142.

Figure 11:
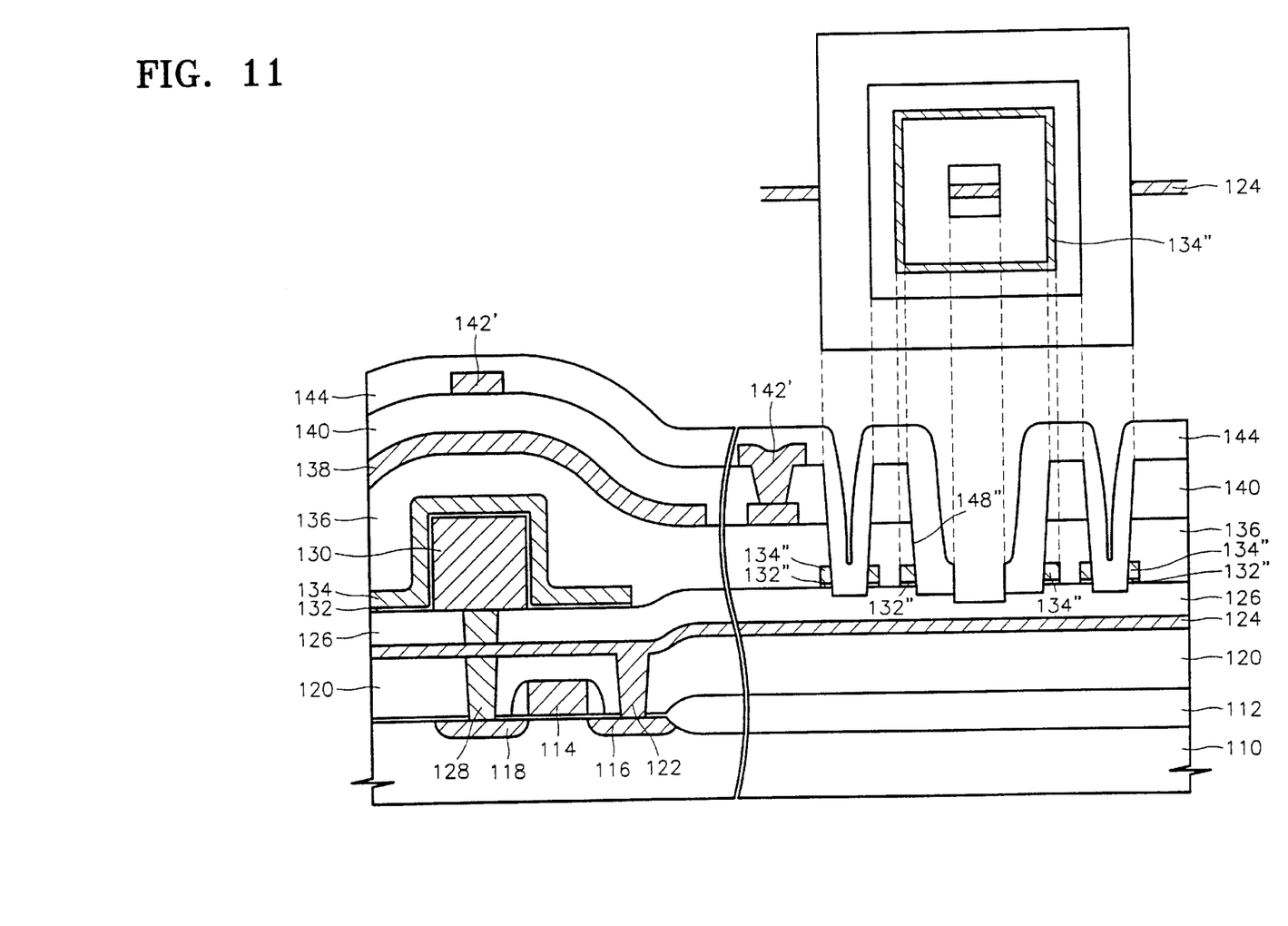

As shown in FIG. 11, the fuse area is completed by depositing the passivation film 144 on the entire surface of the resultant and removing the passivation film deposited on the bottom of the fuse opening 148". Further to the guard ring, a protection film is formed on the sidewall of the fuse opening 148". Accordingly, the absorption of moisture can be completely prevented. The passivation film on the bottom of the fuse opening 148" is removed using the conventional processes of manufacturing the semiconductor device without an additional process. That is, the fuse area can be completed according to the present embodiment without an additional process when a process of exposing the upper interconnection layer 142' by etching the passivation film 144 in order to form a bonding pad (not shown) for performing wire bonding. That is, the fuse area in which the interlayer dielectric film 126 is exposed and the bonding pad (not shown) in which the upper interconnection layer 142' is exposed are formed by plasma etching the passivation film 144 under a pressure of between 300 and 500 mTorr and an RF power of between 1,000 and 1,300W, for between 60 and 95 seconds, using $CF_4$ having a flowrate of between 65 and 90 sccm and $O_2$ having a flowrate of between 10 and 25 sccm as etching gases and flowing Ar of between 80 and 110 sccm.

The thickness of the interlayer dielectric film 126 left on the fuse line 124 can be controlled to be appropriate by slightly etching the interlayer dielectric film 126 by slightly overetching the passivation film 144 on the bottom of the fuse opening 148" when the passivation film 144 is removed by being etched.

As mentioned above, according to the present invention, moisture can be effectively prevented from seeping into the sidewall of the fuse opening and the guard ring can be readily formed since the guard ring which surrounds the fuse opening and the passivation film are integrally formed.

In particular, according to the present invention, the guard ring can be formed using the conventional processes of forming the semiconductor device without an additional process. According to the present embodiment, the fuse opening is simultaneously formed in the process of forming the contact hole of the peripheral circuit by etching the interlayer dielectric films. Therefore, the equipment and time required for forming the fuse opening can be reduced, compared with the conventional process of forming the fuse opening by forming the passivation film and etching the passivation film and the interlayer dielectric films, to thus improve productivity in a mass production system.

According to the present invention, the thickness of the interlayer dielectric film left on the fuse line can be controlled to be appropriate since the depth to which the fuse opening is formed is reduced by forming the fuse opening before finally forming the passivation film, as mentioned above, and using the etching stop film during the formation of the fuse opening.

While this invention has been particularly shown and described with references to preferred embodiments thereof, it will be understood by those skilled in the art that various changes in form and details may be made therein without departing from the spirit and scope of the invention as defined by the following claims.

What is claimed is:

1. A method of forming a fuse area, comprising the steps of:

forming a fuse line;

forming a first interlayer dielectric film on the fuse line;

forming a ring-shaped guard ring opening etching stop film which surrounds an area in which a fuse opening is to be formed on the first interlayer dielectric film using a predetermined conductive layer of a semiconductor device to be formed;

forming a second interlayer dielectric film on the guard ring opening etching stop film;

forming a contact hole required for the semiconductor device, forming a fuse opening, and forming a guard ring opening for exposing the guard ring opening etching stop film at the same time by etching the second interlayer dielectric film, the guard ring opening surrounding the fuse opening and being spaced apart from the fuse opening such that portions of the first and second interlayer dielectric films are interposed between the guard ring opening and the fuse opening;

forming a conductive material layer on the entire surfaces of the contact hole, the guard ring opening, and the second interlayer dielectric film;

forming the upper interconnection layer of the semiconductor device by simultaneously patterning the conductive material layer and removing the conductive material layer formed on the guard ring opening;

removing the guard ring opening etching stop film exposed to the guard ring opening; and forming a guard ring by depositing a passivation film on the entire surfaces of the upper interconnection layer, the guard ring opening, and the second interlayer dielectric film.

2. The method of claim 1 wherein the passivation film is formed of one selected from the group consisting of a silicon nitride film, an undoped silicon oxide film and a compound film of silicon oxide and silicon nitride.

3. The method of claim 1, wherein the semiconductor device is a DRAM device and the guard ring opening etching stop film is formed of a conductive layer which forms the capacitor upper electrode of the DRAM device.

4. The method of claim 1, wherein the conductive material layer and the guard ring opening etching stop film are successively removed using one of etching gas and etching solution having low etching selectivity with respect to a material which forms the conductive material layer and a material which forms the guard ring opening etching stop film, in the steps of removing the conductive material layer formed on the guard ring opening and removing the guard ring opening etching stop film.

5. The method of claim 1, further comprising the step of forming a fuse opening by etching the passivation film and the second interlayer dielectric film in the area surrounded by the guard ring so that an insulating film of a predetermined thickness is left on the fuse line, after the step of forming the guard ring.

6. The method of claim 1, further comprising the steps of:

forming a fuse opening together with the contact hole and the guard ring opening by etching the second interlayer dielectric film in the area surrounded by the guard ring opening etching stop film in the step of forming the contact hole and the guard ring opening;

forming the conductive material layer also on the fuse opening in the step of forming the conductive material layer;

removing the conductive material layer formed on the fuse opening in the step of removing the conductive material layer formed on the guard ring opening;

depositing the passivation film also on the fuse opening in the step of forming the guard ring; and removing the passivation film deposited on the bottom of the fuse opening after the step of forming the guard ring.

* * * * *